US008164366B2

(12) United States Patent
Mei

(10) Patent No.: US 8,164,366 B2
(45) Date of Patent: Apr. 24, 2012

(54) LOCKED LOOPS, BIAS GENERATORS, CHARGE PUMPS AND METHODS FOR GENERATING CONTROL VOLTAGES

(75) Inventor: Shizhong Mei, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/891,273

(22) Filed: Sep. 27, 2010

(65) Prior Publication Data

US 2011/0012655 A1 Jan. 20, 2011

Related U.S. Application Data

(62) Division of application No. 12/355,523, filed on Jan. 16, 2009, now Pat. No. 7,812,652.

(51) Int. Cl.
*H03L 7/06* (2006.01)
(52) U.S. Cl. .......................... 327/156; 327/147
(58) Field of Classification Search .................. 327/147, 327/158
See application file for complete search history.

(56) References Cited

U.S. PATENT DOCUMENTS

| | | | | |
|---|---|---|---|---|
| 6,686,804 B1* | 2/2004 | Adams et al. | ................... | 331/17 |
| 6,744,324 B1* | 6/2004 | Adams et al. | ................... | 331/17 |
| 6,771,114 B2* | 8/2004 | Watarai | ......................... | 327/536 |
| 7,161,401 B2* | 1/2007 | Li | ................................ | 327/157 |
| 7,202,718 B2* | 4/2007 | Lindner et al. | ................ | 327/157 |
| 7,443,252 B2* | 10/2008 | Tu et al. | ......................... | 331/44 |
| 7,634,039 B2* | 12/2009 | Maneatis et al. | .............. | 375/376 |
| 2002/0101289 A1* | 8/2002 | Maneatis | ......................... | 331/17 |
| 2004/0085106 A1* | 5/2004 | Jeong | ............................. | 327/157 |
| 2005/0189973 A1* | 9/2005 | Li | ................................ | 327/157 |
| 2006/0193419 A1* | 8/2006 | Maneatis et al. | .............. | 375/376 |
| 2007/0080751 A1* | 4/2007 | Tu et al. | ......................... | 331/16 |
| 2008/0191783 A1* | 8/2008 | Sudjian et al. | ................ | 327/536 |

OTHER PUBLICATIONS

Maneatis, John G., "*Low-Jitter Process-Independent DLL and PLL Based on Self-Biased Techniques*", IEEE Journal of Solid-State Circuits, vol. 31, No. 11, Nov. 1996, pp. 1723-1724.

* cited by examiner

*Primary Examiner* — Lincoln Donovan
*Assistant Examiner* — Adam Houston
(74) *Attorney, Agent, or Firm* — Dorsey & Whitney LLP

(57) ABSTRACT

Locked loops, bias generators, charge pumps and methods for generating control voltages are disclosed, such as a bias generator that generates bias voltages for use by a clock signal generator, such as a voltage controlled delay line, in a locked loop having a phase detector and a charge pump. The charge pump can either charge or discharge a capacitor as a function of a signal from the phase detector to generate a control voltage. The bias generator can receive the control voltage from the capacitor, and it generates bias voltages corresponding thereto. A portion of the bias generator can have a topography that is substantially the same as at least a portion of the topography of the charge pump. As a result, it can cause the charge pump to charge the capacitor at the same rate that it discharges the capacitor over a relatively wide range of control voltages. The charge pump and the bias generator can also include circuitry for limiting the charging of the capacitor when the control voltage is relatively low.

20 Claims, 5 Drawing Sheets

LOCKED LOOPS, BIAS GENERATORS, CHARGE PUMPS AND METHODS FOR GENERATING CONTROL VOLTAGES

CROSS-REFERENCE TO RELATED APPLICATION

This application is a divisional of U.S. patent application Ser. No. 12/355,523, filed Jan. 16, 2009, U.S. Pat. No. 7,812,652. This application and patent is incorporated by reference herein in its entirety and for all purposes.

TECHNICAL FIELD

This invention relates to semiconductor integrated circuits, and, more particularly, in one or more embodiments, to bias generators, charge pumps and methods for generating control voltages to voltage controlled delay lines and voltage controlled oscillators in locked loop circuits.

BACKGROUND OF THE INVENTION

A number of different types of locked loop circuits are used in conventional integrated circuits, the two most notable being delay lock loops and phase lock loops. Both of these types of locked loops use a phase detector to compare the phase of a reference clock signal to the phase of a feedback clock signal generated by the locked loop. A phase error signal generated from the comparison is applied to a controller (i.e., a combination of a charge pump and a bias generator) which, in turn, generates an appropriate control signal(s) that is applied to a variable delay line in the case of a delay lock loop or a voltage controlled oscillator in the case of a phase lock loop.

A typical prior art delay lock loop 10 is shown in FIG. 1. The delay lock loop 10 includes a phase detector 12 having a first input receiving a reference clock signal Clk_ref and a second input receiving a feedback clock signal Clk_fb, which is generated from an output clock signal Clk_out. The phase detector 12 generates an UP signal in response to a phase error in one direction, and it generates a DN signal in response to a phase error in the opposite direction. These UP and DN signals are applied to a charge pump 16, which provides a control voltage Vct across a capacitance, such as capacitor 18. As explained in greater detail below, the charge pump 16 also receives a feedback voltage Vfb, which attempts to maintain the rate of charge of the capacitor 18 equal to the rate of discharge. In response to the UP signal, the charge pump 16 charges the capacitor 18 to increase the control voltage Vct, and, in response to the DN signal, the charge pump 16 discharges the capacitor 18 to decrease the control voltage Vct.

The control voltage Vct is applied to a bias generator 20 that generates two bias voltages Vbp, Vbn as a function of the magnitude of the control voltage Vct. These bias voltages Vbp, Vbn control the delay of a voltage controlled delay line 24 as the reference clock signal Clk_ref is coupled through the delay line 24 to generate the output clock signal Clk_out.

There is therefore a need for an improved bias generator operating with a charge pump in a locked loop, such as one that ensures a more even balance between the charge current and the discharge current of the charge pump.

DETAILED DESCRIPTION

The charge pump 16 used in the prior art delay lock loop 10 is able to balance the charge and discharge currents to only a limited extent. One reason for this limitation is that the topography of the charge pump 16 differs too greatly from the topography of the bias generator 20 and the voltage controlled delay line 24, which results in an excessive lack of operating symmetry between the charge pump 16 on the one hand and the bias generator 20 and the voltage controlled delay line 24 on the other. Another reason is that, when the control voltage Vct is at the low end of its operating range, the relatively large voltage differential between the supply voltage Vcc and the control voltage Vct results in an excessive charging current. For example, with a supply voltage Vcc of 1 volt, the operating range of Vct is between 0 volts and 0.5 volts. Yet the voltage differential between Vcc and the control voltage Vct is so great at the low end of the range that the discharge and charge currents are substantially equal only about in the range 0.35 volt to 0.5 volt.

Figure 1:
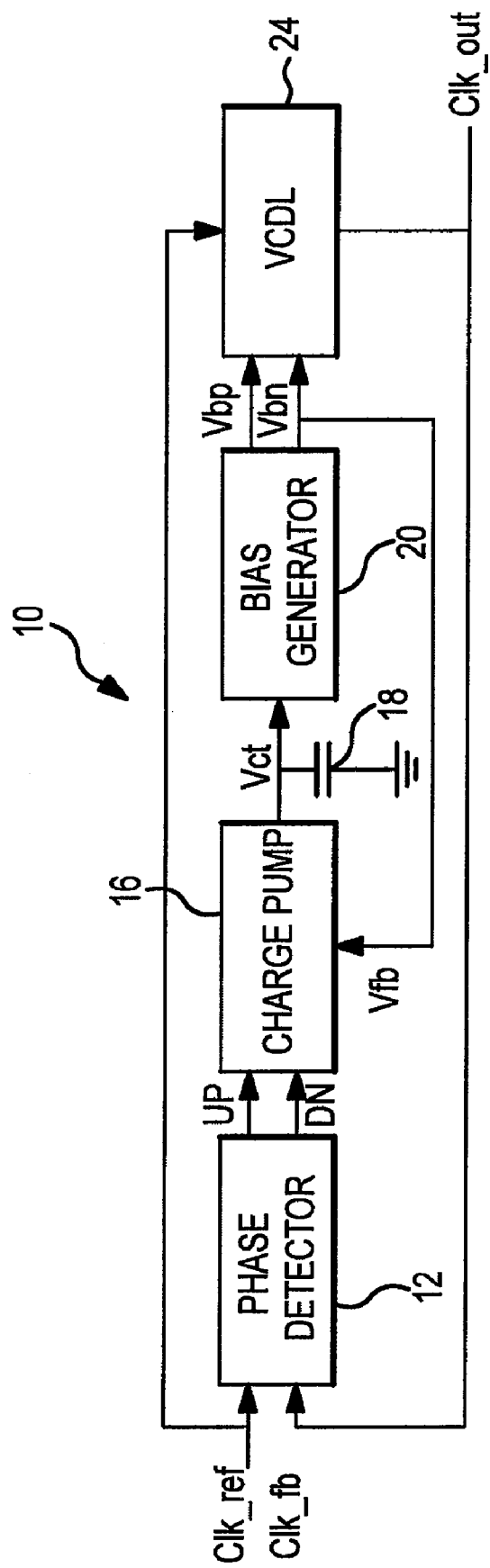
FIG. 1 is a block diagram of a prior art delay lock loop that can use embodiments of a charge pump and bias generator in accordance with the invention.
Figure 2:
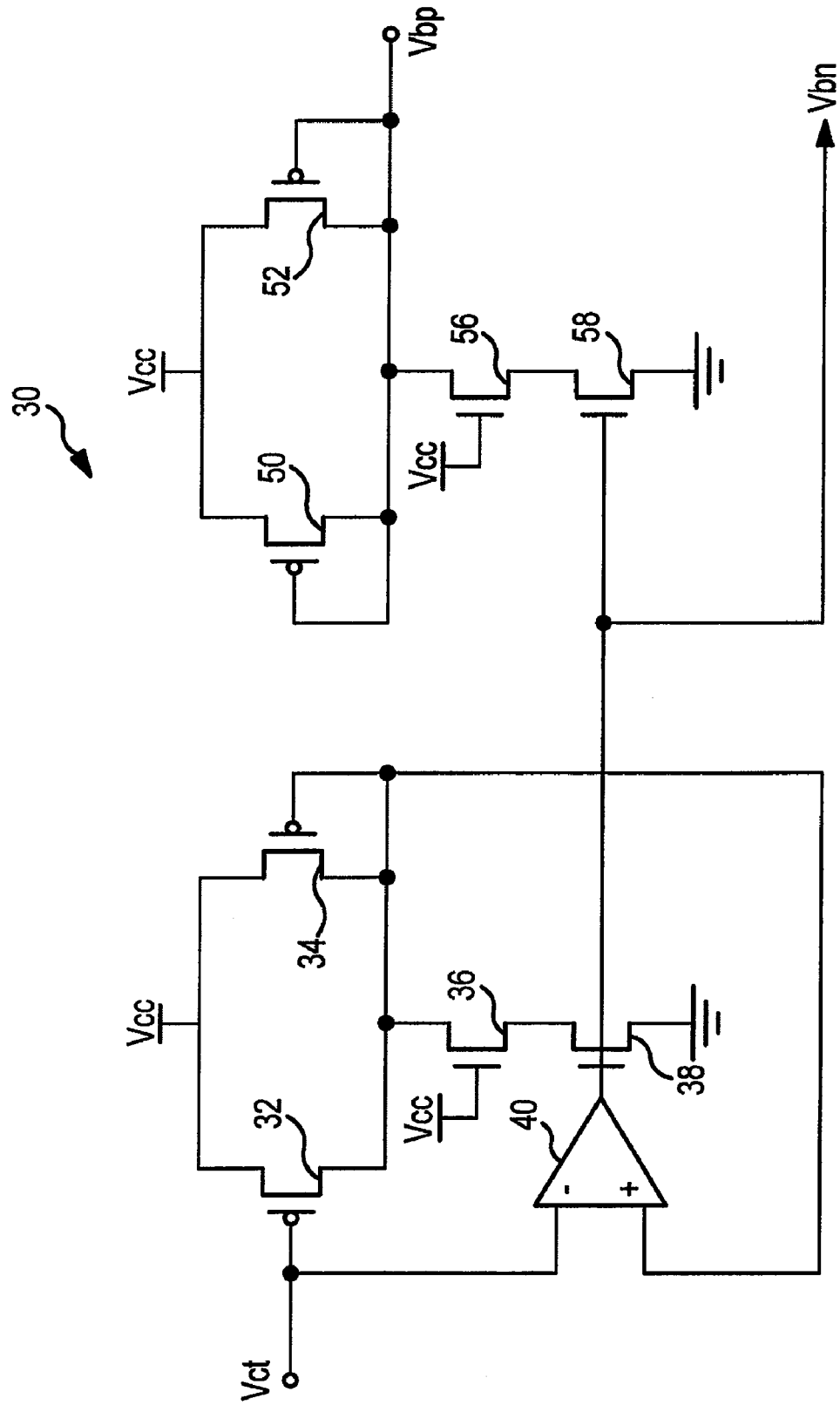
FIG. 2 is a schematic diagram of a typical prior art bias generator.

A typical example of a prior art bias generator 30 that can be used as the bias generator 20 (FIG. 1) is shown in FIG. 2. The bias generator 30 includes a differential pair of PMOS transistors 32, 34, of which 32 receives the control voltage Vct at its gate. The gate of the other PMOS transistor 34 is coupled to the drain of the transistor 32 in a diode configuration. These sources of both transistors 32, 34 are coupled to a supply voltage Vcc. The combined current flowing through the transistors 32, 34 is controlled by a first NMOS transistor 36, which is biased to a conductive state, and a second NMOS transistor 38 as a function of a voltage applied to its gate. A high gain differential amplifier 40 receives at respective inputs the control voltage Vct and a feedback voltage from the drains of the PMOS transistors 32, 34 and generates one of the bias voltages Vbn. This bias voltage Vbn is applied to the gate of the transistor 38 to control the combined current flowing through the PMOS transistors 32, 34.

The bias generator 30 also includes a second pair of differential PMOS transistors 50, 52, both of which have their gates diode-coupled. The combined current through the transistors 50, 52 is also controlled by an NMOS transistor 56 having its gate coupled to the supply voltage Vcc and a second NMOS transistor 58, which also receives the bias voltage Vbn at its gate. The other bias voltage Vbp is generated at the drains of the transistors 50, 52.

In operation, a decrease in the control voltage Vct correspondingly decreases the voltage drop across the transistors 32, 34 thereby increasing the feedback voltage applied to the positive input of the differential amplifier 40. As a result, the bias voltage Vbn generated by the differential amplifier 40 increases, thereby increasing the current flowing through the NMOS transistor 38. This increased current reduces the feedback voltage applied to the differential amplifier 40 until it is substantially equal to the control voltage Vct. The circuit responds in the opposite manner to an increase in the control voltage Vct to decrease the bias voltage Vbn. Thus, the bias voltage Vbn varies inversely with the control voltage Vct.

An increase in the bias voltage Vbn also increases the current flowing through the PMOS transistors 50, 52, thereby decreasing the magnitude of the bias voltage Vbp. Thus, the bias voltage Vbp varies inversely with the bias voltage Vbn and, therefore, in the same manner as the control voltage Vct. Insofar as the circuit generating the bias voltage Vbp is substantially to the same as the circuit generating the feedback voltage applied to the differential amplifier 40, the magnitude of the bias voltage Vbp is substantially equal to the feedback voltage. Further, since the amplifier 40 has a very high gain, the magnitude of the feedback voltage Vbp is substantially equal to the magnitude of the control voltage Vct. Therefore, the magnitude of the bias voltage Vbp is substantially equal to the magnitude of the control voltage Vct.

As will be explained below, the topography of the prior art bias generator 30 differs substantially from the topography of the charge pump 16 that is typically used. In fact, as will be explained below, the bias generator 30 uses a topography that is very similar to the topography used in a delay stage of the voltage controlled delay line 24. The charge pump 16 typically used is thus generally unable to closely balance the charge current and the discharge current of the capacitor 18.

Figure 3:
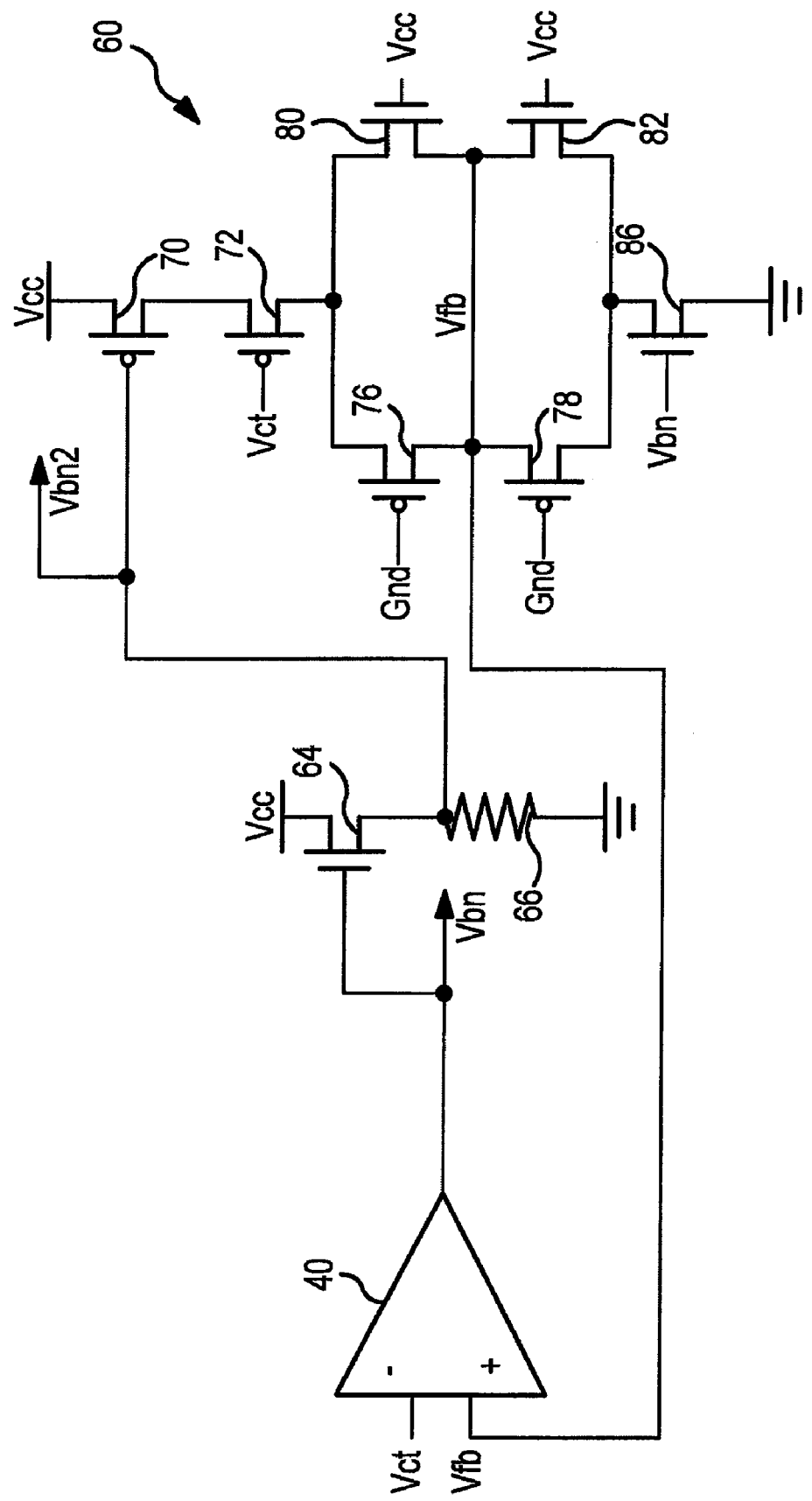
FIG. 3 is a schematic diagram of a bias generator according to an embodiment of the invention.

A bias generator 60 according to an embodiment of the invention is shown in FIG. 3. The bias generator 60, like the bias generator 30, includes the differential amplifier 40 having inputs receiving the control voltage Vct and a feedback voltage, and generating one of the bias voltages Vbn at the output of the amplifier 40. The bias voltage Vbn is applied to the gate of an NMOS transistor 64, which is connected in series with a resistance, such as a resistor 66, between the supply voltage Vcc and ground.

In operation, an increase in the bias voltage Vbn increases the current flowing through the resistor 66, thereby increasing the magnitude of the second bias voltage Vbn2. The bias generator 60 also includes two PMOS transistors 70, 72 connected in series with the supply voltage Vcc, although the PMOS transistor 70 may be omitted in some embodiments of the invention. The PMOS transistor 70 receives the second bias voltage Vbn2 at its gate, and the PMOS transistor 72 receives the control voltage Vct at its gate. Two additional PMOS transistors 76, 78 and 2 NMOS transistors 80, 82 are coupled in a parallel/series configuration. The PMOS transistors 76, 78 are biased to a conductive state by having their gates coupled to ground, and the NMOS transistors 80, 82 are likewise biased to a conductive state by having their gates coupled to the supply voltage Vcc. Finally, the parallel/series combination of transistors are coupled to ground through an NMOS transistor 86, which receives the bias voltage Vbn at its gate.

In operation, an increase in the control voltage Vct results in a decrease in the bias voltage Vbn at the output of the differential amplifier 40. This decreased voltage of Vbn also reduces the magnitude of the bias voltage Vbn2. The decreased voltage Vbn results in an increase in the voltage at the drain of the NMOS transistor 86, thereby resulting in an increase in the voltage fed back to the positive input of the differential amplifier 40 until the magnitude of the feedback voltage is substantially equal to the magnitude of the control voltage Vct. The corresponding decrease in the voltage Vbn2 would have a tendency to increase the feedback voltage. However, this tendency is countered to some extent by the increase in the control voltage Vct applied to the gate of the PMOS transistors 72. At any rate, this tendency is not enough to have an effect on the feedback voltage that is equal to the effect of the decrease in the voltage Vbn applied to the gate of the transistor 86. Thus, the magnitudes of the bias voltages Vbn and Vbn2 vary inversely with the magnitude of the control voltage Vct. Also, by coupling the gates of the PMOS transistors 76, 78 to ground and coupling the gates of the NMOS transistors 80, 82 to Vcc, the feedback voltage is compensated for variations in the supply voltage Vcc.

Figure 4:
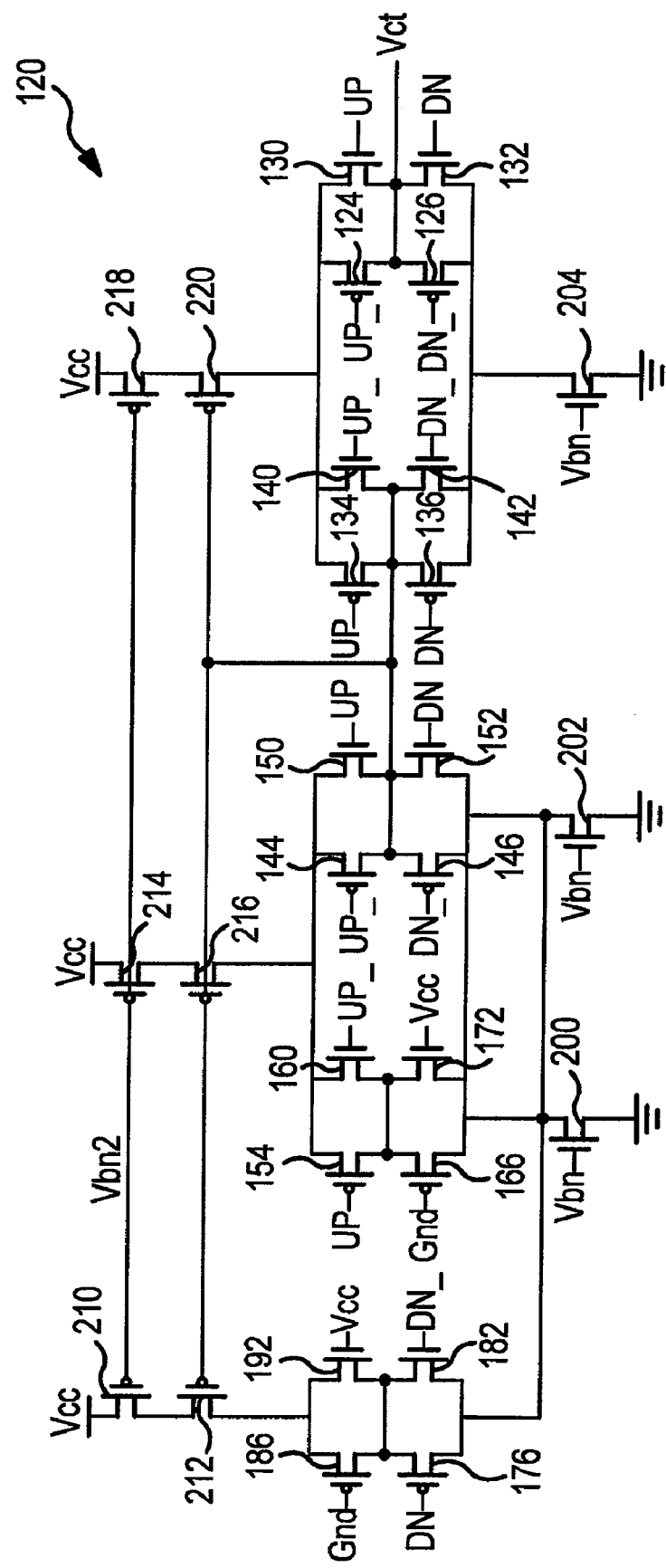
FIG. 4 is a schematic diagram of a charge pump according to an embodiment of the invention.

A charge pump 120 according to one embodiment of the invention is shown in FIG. 4. As explained in greater detail, the circuitry used in the charge pump 120 can be balanced to provide the control voltage Vct in a manner that does not alter the current drawn by the charge pump 120. The charge pump 120 includes a parallel/series combination of PMOS transistors 124, 126 and NMOS transistors 130, 132. The control voltage Vct is produced at the junctions between the PMOS transistors 124, 126 and the NMOS transistors 130, 132. The gate of the NMOS transistor 130 receives the UP signal from the phase detector 12 (FIG. 1) while the gate of the PMOS transistor 124 receives a complementary UP_signal. Similarly, the gate of the NMOS transistor 132 receives the DN signal from the phase detector 12 while the gate of the PMOS transistor 126 receives a complementary DN_signal.

In operation, an increase in the UP signal and a corresponding decrease in the UP_signal results in an increase in the control voltage Vct, and an increase in the DN signal and a corresponding decrease in the DN_signal results in a decrease in the control voltage Vct. However, the changes in current resulting from these signals is balanced by other transistors in the charge pump 120. Specifically, PMOS transistors 134, 136 have substantially the same topography as the PMOS transistors 124, 126, but they receive signals that are the complement of the signals received by the PMOS transistors 124, 126. Similarly, the NMOS transistors 140, 142 have substantially the same topography as the NMOS transistors 130, 132, but they receive signals that are the complement of the signals received by the NMOS transistors 130, 132.

The transistors 124-142 are also balanced by the remaining transistors in a similar configuration in the charge pump 120. Specifically, PMOS transistors 144, 146 have substantially the same topography and receive the same signals as the PMOS transistors 124, 126, and NMOS transistors 150, 152 have substantially the same topography and receive the same signals as the NMOS transistors 130, 132. Similarly, a PMOS transistor 154 and an NMOS transistor 160 have substantially the same topography and receive the same signals as the PMOS transistor 134 and the NMOS transistor 140, respectively. While a PMOS transistor 166 and an NMOS transistor 172 have substantially the same topography as the PMOS transistor 136 and the NMOS transistor 142, they do not receive the same signals. However, a PMOS transistor 176 and an NMOS transistor 182 have substantially the same topography and receive the same signals as the PMOS transistor 136 and the NMOS transistor 142, respectively. Also, PMOS transistor 186 and NMOS transistor 192 have substantially the same topography and receive the same signals as the PMOS transistor 166 and the NMOS transistor 172, respectively. Therefore, the circuit operates in a balanced manner.

The magnitude of the current through the above-described transistors are controlled by NMOS transistors 200, 202, 204 and PMOS transistors 210, 212, 214, 216, 218 and 220. The PMOS transistors 212, 216, 220 are controlled by a feedback signal generated at the junctions between the NMOS transistors 134, 136 and the PMOS transistors 140, 142 as well as the junctions of the PMOS transistors 144, 146 and the NMOS transistors 150, 152. Because of the symmetry of the circuit, the feedback voltage is substantially equal to the control voltage Vct. In operation, the bias voltage Vbn fed back to the gates of the NMOS transistors 200-204 result in negative feedback since, as explained above, the bias voltage Vbn varies inversely with the control voltage Vct. The bias voltage Vbn functions to maintain the charge rate and discharge rate of the capacitor 18 balanced.

At least some conventional charge pumps are similar to the charge pump 120 shown in FIG. 4. The charge pump 120 differs from these conventional charge pumps by including the PMOS transistors 210-218 in series with each of the PMOS transistors 212-220, respectively. As explained above, the bias voltage Vbn2 varies inversely with the control voltage Vct. Therefore, when the control voltage Vct is at the bottom of its operating range, the bias voltage Vbn2 applied to the gates of the PMOS transistors 210, 214, 218 increases to reduce the magnitude of the current charging the capacitor 18, thereby preventing the capacitor 18 from being charged at a faster rate than it is discharged. As a result, the charge pump 120 provides a substantially more balanced charging and discharging of the capacitor 18.

Although the use of the PMOS transistors 210, 214, 218 provides the advantage of preventing more current from being sourced to the capacitor 18 than can be sunk by the NMOS transistors 200-204, they may be omitted in some embodiments of the invention. The charge pump 120 will still provide more balanced charging and discharging of the capacitor 18 as long as it is used with a bias generator, like the bias generator 60, that has substantially the same topography as the charge pump 120. Thus, if the PMOS transistors 210, 214, 218 are included in an embodiment of the charge pump, the PMOS transistor 70 (FIG. 3) should ideally be included in an embodiment of the bias generator. As explained above, prior art bias generators have a topography that is substantially different than the topography used by the bias generator 60. Insofar as the bias generator 60 has a topography that is substantially the same as at least a portion of the topography of the charge pump 120, the charging and discharging balance of the charge pump 120 is substantially improved.

Figure 5:
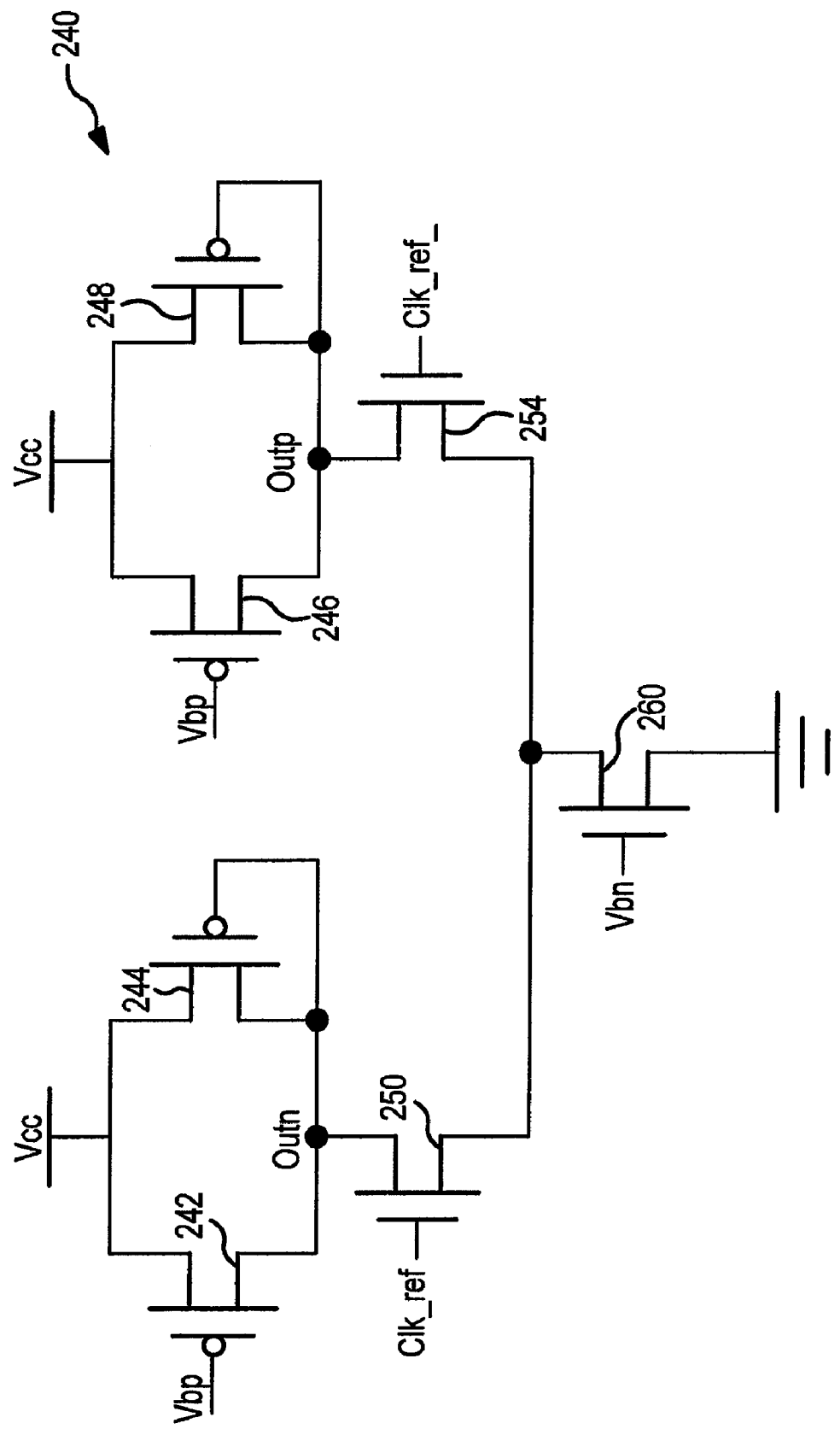
FIG. 5 is a schematic diagram of a delay stage that can be used in the voltage controlled delay line that is used in the delay lock loop of FIG. 1.

A stage 240 of the delay line 24 that can be used in the delay locked loop 10 of FIG. 1 when it contains the charge pump 120 and bias generator 60 is shown in FIG. 5. The delay stage 240 includes a first pair of PMOS transistors 242, 244 and a second pair of PMOS transistors 246, 248 all of which have their respective sources coupled to the supply voltage Vcc. The drains of the PMOS transistors 242, 244 are connected to each other, and the gate of the PMOS transistor 244 has a diode-coupled configuration. The gate of the PMOS transistor 242 receives the bias voltage Vbp. Similarly, the drains of the PMOS transistors 246, 248 are connected to each other, and the gate of the PMOS transistor 248 has a diode-coupled configuration. The gate of a first NMOS transistor 250 receives the reference clock signal Clk_ref and the gate of a second NMOS transistor 254 receives a complement of the reference clock signal, Clk_ref_. Finally, the gate of an NMOS transistor 260 also receives the bias signal Vbn. Complementary clock output signals Outn, Outp are generated at the drains of the NMOS transistors 250, 254, respectively.

In operation, an increase in the bias voltage Vbp results in an increase in the time required to switch the clock output signals Outn, Outp high, and a corresponding decrease in the bias voltage Vbn results in an increase in the time required to switch the output signals Outn, Outp low. Therefore, the delay of the voltage controlled delay line 24 using the delay stages 240 is increased. Conversely, a decrease in the bias voltage Vbp results in a decrease in the time required to switch the clock output signals Outn, Outp high, and a corresponding increase in the bias voltage Vbn results in a decrease in the time required to switch the output signals Outn, Outp low. As a result, the delay of the voltage controlled delay line 24 using the delay stages 240 is decreased.

Although the present invention has been described with reference to the disclosed embodiments, persons skilled in the art will recognize that changes may be made in form and detail without departing from the invention. Such modifications are well within the skill of those ordinarily skilled in the art. Accordingly, the invention is not limited except as by the appended claims.

I claim:

1. A method of generating a control voltage for a voltage controlled delay line, comprising:
   receiving a first signal indicative of a difference in phase between a reference clock signal and an output clock signal;
   generating at a first circuit a second signal from the first signal; and
   using the second signal to generate at a second circuit the control voltage,
   wherein first and second circuits both include:
   a first transistor of a first type and a first transistor of a second type coupled to each other in a first parallel combination; and
   a second transistor of the first type and a second transistor of the second type coupled to each other in a second parallel combination and in series with the first parallel combination.

2. The method of claim 1 wherein the control voltage comprises first and second control voltages, and wherein the act of using the second signal to generate at the second circuit the control voltage comprises:
   generating the first control voltage with a magnitude corresponding to a difference between a magnitude of a voltage of the second signal and a magnitude of a feedback voltage;
   generating the second control voltage from the first control voltage; and
   using the first and second control voltages to generate the feedback voltage.

3. The method of claim 2, further comprising compensating the feedback voltage for variations in at least one supply voltage used to generate the first and second control voltages.

4. The method of claim 2 further comprising:
   increasing a time to switch an output of a stage of the voltage controlled delay line high in response to an increase in the first control voltage; and
   decreasing the time to switch the output of the stage of the voltage controlled delay line high in response to a decrease in the first control voltage.

5. The method of claim 4 further comprising:
   increasing a time to switch the output of the stage of the voltage controlled delay line low in response to a decrease in the second control voltage; and
   decreasing the time to switch the output of the stage of the voltage controlled delay line low in response to an increase in the second control voltage.

6. The method of claim 3, further comprising providing a second signal in a manner that does not substantially alter a current drawn.

7. The method of claim 6, further comprising limiting a current of the second signal when a voltage of the second signal is at a lower limit of an operating range of the second signal.

8. The method of claim 1, wherein the first signal is comprised of an UP signal and a DOWN signal, the method further comprising:

increasing the second signal in response to an increase in the UP signal; and decreasing the second signal in response to a decrease in the DOWN signal.

9. The method of claim 1, further comprising generating the first signal at a phase detector.

10. The method of claim 1 wherein the first circuit comprises a charge pump.

11. The method of claim 10 wherein the charge pump comprises:

a third transistor of the first type coupled between a first power supply voltage and the first parallel combination; and a third transistor of the second type coupled between a second power supply voltage and the second parallel combination.

12. The method of claim 1 wherein the second circuit comprises a bias generator.

13. A method of generating a control voltage for a voltage controlled delay line, comprising:

comparing a phase of a reference clock and a phase of a feedback clock to provide a phase error signal indicative of a phase difference;

generating a control signal at a charge pump responsive to the phase error signal, wherein the charge pump includes a first circuit having a parallel/series combination of transistors used in generating the control signal, the combination of transistors including series coupled transistors of a first type and series coupled transistors of a second type;

generating a control voltage at a bias generator corresponding to the control signal, wherein the bias generator includes a second circuit having the same parallel/series combination of transistors used in generating the control voltage, the combination of transistors including series coupled transistors of the first type and series coupled transistors of the second type; and providing the feedback clock for comparison having a phase based at least in part on the control voltage.

14. The method of claim 13 wherein generating a control signal responsive the phase error signal comprises:

charging and discharging a capacitor based at least in part on the phase error signal.

15. The method of claim 13 wherein providing the feedback clock for comparison having a phase based at least in part on the control voltage comprises:

delaying the reference clock by a delay adjusted responsive to the bias voltage to provide the feedback clock.

16. The method of claim 13 wherein comparing a phase of a reference clock and a phase of a feedback clock to provide a phase error signal comprises:

generating a first error signal responsive to a first polarity of the difference between the phase of the reference clock and the phase of the feedback clock; and generating a second error signal responsive to a second polarity of the difference between the phase of the reference clock and the phase of the feedback clock.

17. The method of claim 16 wherein generating a control signal responsive the phase error signal comprises:

charging a capacitor responsive the first error signal; and discharging a capacitor responsive the second error signal.

18. The method of claim 13 wherein generating a control voltage corresponding to the control signal comprises:

generating the control voltage using the bias generator including a portion having a first topography; and generating the control signal using the charge pump including a portion having a second topography, the second topography of the charge pump substantially similar to the first topography of the bias generator.

19. The method of claim 13, further comprising:

compensating the feedback clock for variations in at least one supply voltage used to generate the control signal.

20. The method of claim 13 wherein generating the control voltage comprises:

generating first and second control voltages.

* * * * *